United States Patent [19]

Bonneau et al.

[11] Patent Number: 5,155,572
[45] Date of Patent: Oct. 13, 1992

[54] VERTICAL ISOLATED-COLLECTOR PNP TRANSISTOR STRUCTURE

[75] Inventors: Dominique Bonneau; Myriam Combes, both of Evry, France; Anthony J. Dally, Pleasant Valley, N.Y.; Pierre Mollier, Boissise Le Roi, France; Seiki Ogura, Hopewell Junction, N.Y.; Pascal Tannhof, Cely en Biere, France

[73] Assignee: International Business Machines Corporation, Armonk, N.Y.

[21] Appl. No.: 680,490

[22] Filed: Apr. 4, 1991

[30] Foreign Application Priority Data

Apr. 10, 1990 [EP] European Pat. Off. ........ 90480056.2

[51] Int. Cl.⁵ .......................................... H01L 27/02
[52] U.S. Cl. ....................................... 357/43; 357/48; 357/34; 357/44; 357/86; 357/46
[58] Field of Search ............... 357/43, 48, 46, 47, 357/44, 86

[56] References Cited

U.S. PATENT DOCUMENTS 4,564,855  1/1986  Van Zanten ..................... 357/46
4,887,141  12/1989  Bertotti et al. ................... 357/48
4,979,008  12/1990  Siligoni et al .................... 357/48

FOREIGN PATENT DOCUMENTS 0327859  2/1988  European Pat. Off. .
2248613  10/1974  France .

OTHER PUBLICATIONS

Solid State Technology, vol. 16, No. 4, Apr. 1973, Washington U.S., pp. 53-68; S. C. Su et al.; "A New Complementary Bipolar Transistor Structure".

Primary Examiner—Rolf Hille
Assistant Examiner—Roy Potter
Attorney, Agent, or Firm—Richard A. Romanchik; Michael J. Balconi-Lamica

[57] ABSTRACT

A vertical isolated-collector PNP transistor structure (58) comprises a P+ region (45), a N region (44) and a P− well region (46) which form the emitter, the base and the collector, respectively. The P− well region is enclosed in a N type pocket comprised of a N+ buried layer (48) and a N reach-through region (47) in contact therewith. The contact regions (46-1, 47-1) to the P− well region (46) and to the N reach-through region (47) are shorted to define a common collector contact (59). In addition, the thickness W of the P− well region (46) is so minimized to allow transistor action of the parasitic NPN transistor formed by N PNP base region (44), P− well region (46) and the N+ buried layer, (48) respectively as the collector, the base and the emitter of said PNP transistor. The PNP transistor structure (67) may be combined with a conventional NPN transistor structure (61).

4 Claims, 4 Drawing Sheets

5,155,572

VERTICAL ISOLATED-COLLECTOR PNP TRANSISTOR STRUCTURE

TECHNICAL FIELD

The present invention relates generally to semiconductor devices and more particularly to a vertical isolated-collector PNP transistor structure that can be advantageously used in BICMOS circuits wherein the output stage consists of top PNP/bottom NPN complementary bipolar transistors.

BACKGROUND ART

A typical BICMOS logic circuit generally comprises two different stages: a first stage consisting of CMOS FETs to achieve the desired logic function; and a second stage, generally comprised of a pair of bipolar transistors to operate as the output driving stage. FETs are used in the first stage to perform the desired logic function because of their superior integration density, low power dissipation and better logic efficiency. Bipolar transistors are utilized in the second, driver stage because of their ability to supply higher currents per unit area. Bipolars therefore require less space than MOSFETs in similar operating conditions and they also exhibit a higher transconductance.

Different schemes exist for utilizing bipolar transistors in BICMOS output stage circuits. For example, U.S. Pat. No. 3,541,353 (Seelbach et al.) discloses an output stage circuit comprised of a top NPN pull-up transistor art a bottom PNP pull-down transistor. According to Seelbach et al., a pair of complementary bipolar transistors are connected in an Emitter Follower (EF) configuration in a manner typical of "Integrated Complementary Logic (ICL)" technology utilized in the BICMOS environment. The two emitters are tied together and the resulting common node is connected to an output terminal. The collectors of the top NPN transistor and the bottom PNP transistor are respectively connected to a positive voltage and to the ground. This version was used early in the art, because all the collectors of NPN transistors are connected to the positive voltage. As a result, collectors are buried and merged, thereby allowing higher possible integration density. In addition, there is no difficulty in manufacturing such a vertical grounded-collector PNP transistor, as will be explained later on. Also, according to this configuration, the influence of the collector-substrate capacitance Ccs is eliminated. However, in the ICL technology, additional biasing means must be connected to the output transistors. This is illustrated in IBM Technical Disclosure Bulletin, Vol. 29, Sept 1986, pp 1857–1858 in an article entitled: "Complementary FET bipolar circuit", by F. Montegari. As depicted in this reference, the extra FET connected between the bases of the bipolar output transistors acts as a voltage shifter for adequate operation. Finally, because the two transistors in the output stage are connected in an Emitter-Follower configuration, the first stage must supply full swing voltage swings, which thereby limits speed performance.

Another version of a bipolar output stage circuit having complementary transistors is disclosed in US U.S. Pat. No. 3,879,619 (Pleshko). This versions consists of top PNP/bottom NPN bipolar transistors. FIG. 1 of the present application shows an electrical schematic in accordance with the teachings of Pleshko. Circuit 10 of FIG. 1 comprises a CMOS logic gate block 11 which performs the logic function, followed by a driving block 12 to operate as the output stage circuit. Block 12 comprises top PNP and bottom NPN bipolar transistors respectively referenced TUP and TDN. Emitters of said transistors are respectively connected to a first supply voltage: a positive voltage (VH) at terminal 13 and a second supply voltage: the ground (GND) at terminal 14. The logic gate block 11 comprises six FETs P1, P2, P3, N1, N2 and N3 connected between VH and GND and driven by logic input signals A1 and A2, applied through terminals 15 and 16 respectively. FETs P3 and N3 are only used for biasing the bases of output transistors TUP and TDN in the quiescent state. The circuit output signal VOUT is available at terminal 17 which is at the same potential as the common output node N formed between the collector regions of output transistors TUP and TDN. The bases of transistors TUP and TDN are driven separately since they are connected to nodes 18 and 19 of logic gate block 11. No voltage shifting means are necessary in this implementation. Circuit 10 depicted in FIG. 1 is a two-input NAND gate, but other circuits performing different logical functions can be built as well. In addition, should the PNP transistor be a high performance transistor, (low collector resistance and a low collector-substrate capacitance Ccs), the BICMOS logic circuit would have excellent speed performances, because both output transistors operate as amplifiers. Moreover, in circuit 10 of FIG. 1, all the FETs can be very small devices because the output transistors need smaller input voltage swings when compared to the former version. For all these reasons, circuit 10 of the complementary inverter type appears very promising.

However, some difficulties are circuit of FIG. 1 is to be integrated with standard BICMOS technologies of the "merged" type, i.e. circuits that combine one bipolar transistor and one FET device (e.g. the NPN transistor P channel FET) in the same well. These technologies usually offer only vertical grounded-collector PNP transistor structures as illustrated in FIG. 2 of the present invention. In the cross-sectional view of FIG. 2, structure 20 comprises both NPN and PNP transistor structures referenced 21 and 22 formed in a P substrate (the respective FET devices have not been shown for sake of simplicity). Structures 21 and 22 are separated by a recessed oxide (ROX) region 24-1. The PNP transistor structure 22 is formed in a low doped P− well 25 embedded in a pocket resulting from the combination of the P+subcollector layer 26 and a P collector reach-through region 27, the latter including a P+collector contact region 27-1. To lower the collector contact resistance, the collector reach-through region 27 is generally U- shaped. The emitter and base regions are respectively referenced 28 and 29. The base region 29 and the collector contact region 27-1 are isolated by a ROX region 24-2. On the other hand, the NPN transistor structure 22 is quite standard and is only briefly detailed hereafter. The NPN structure 21 comprises an N+ emitter region 30 and a P base region 31 formed in a N− well region 32 embedded in a pocket resulting from the combination of a N+ subcollector layer 33 and a N reach-through region 34 provided with a N+ collector contact region 34-1. As apparent from FIG. 2, there are no parasitic devices around the PNP structure Unfortunately though, the structure of FIG. 2 is inadequate when isolated-collector PNP transistor structures are desired. As a matter of fact, because the P substrate 23 is connected to the ground, the P collector region 26/27 of the PNP transistor is also at the potential of the ground.

The manufacturing process used to fabricate the structures illustrated in FIG. 2 may be adapted to build a vertical isolated-collector PNP transistor, taking advantage of the existence of the N+ subcollector layer that is required in the fabrication of the NPN transistor.

A known vertical isolated-collector PNP transistor structure is shown in FIG. 3, and basically consists of a P+ region 36 as the emitter, a portion of the N-epitaxial layer 37 as the base, and the P+ buried subcollector region 38/P+ reach-through region 39 as the collector. This conventional PNP structure 35 is enclosed in a N+ pocket comprised of a N+ buried region 40 in contact with a ring-shaped N+ reach-through region 41 for isolating the collector region 38/39 of the PNP transistor from the P substrate 23. At the surface of the wafer, active regions are separated by appropriate ROX regions 42-1 and 42-2. The PNP transistor structure of FIG. 3 is not fully satisfactory, however, for the following two reasons. First, integration density is reduced due to the loss in silicon area caused by region 40/41. Second, the two highly doped buried regions 38 and 40, that are in intimate contact, generate dislocations that are detrimental to the quality and functionality of the resulting PNP transistor structure 35. This second inconvenience can be avoided by restricting the doping of the buried sub-collector region 40 and reach-through region 41, but not without parasitic devices emerging.

It is to be noted that the manufacturing process of the PNP transistor of FIG. 3 must have specific steps of forming the P+ subcollector region and the P+ reach-through region 39 that are not required to fabricate the NPN transistor structure. However, these extra steps have the great advantage of resulting in a perfectly isolated PNP transistor structure.

DISCLOSURE OF THE INVENTION

An object of the present invention is to provide a high performance vertical PNP transistor structure with an isolated-collector.

Another object of the present invention is to provide a vertical isolated-collector PNP transistor structure that does not require a specific P+ subcollector region and a P+ reach-through region.

Another object of the present invention is to provide a vertical isolated-collector PNP transistor structure for which the manufacturing process is simpler and fully compatible with NPN transistor manufacturing.

Yet a further object of the present invention is to provide a vertical isolated-collector PNP transistor structure that can be merged with a standard NPN transistor to further increase integration density of all complementary bipolar and BICMOS logic circuits.

According to the present invention, a vertical isolated-collector PNP transistor structure having a P+ region as the emitter, a N region as the base and a P− well region as the collector includes a P− well collector region which is enclosed in a pocket consisting of a ring-shaped N reach-through region and a N+ buried layer for isolation of the P− well collector region from the substrate. The P− well collector region and the N reach-through region are respectively provided with a P+ and a N+ contact region at the wafer surface. The N+ reach-through contact region and the P+ collector contact region are shorted together to form the collector electrode of the PNP transistor. In a preferred embodiment, these regions can be made adjacent, and receive a common collector contact electrode.

To further improve the performances of the above described PNP transistor, the P− well collector region is made thin enough so that the parasitic NPN transistor formed by the N type PNP transistor base as the emitter, the P− well collector region as the base, and the N+ buried layer as the collector, is made active. Reducing the P− well collector region thickness also increases its resistance which unfavorably impacts the performances of the PNP transistor. The NPN parasitic transistor, however, has a global beneficial action on the performances of the PNP transistor.

Finally, the PNP transistor structure of the present invention can be easily merged with a conventional NPN transistor to form a dense and compact integrated structure that can be advantageously used as the output stage circuit of the BICMOS logic circuit of the complementary bipolar type mentioned above in conjunction with FIG. 1.

These and other objects, features and advantages thereof, may best be understood by reference to the following detailed description of an illustrated preferred embodiment to be read in conjunction with the accompanying drawings.

BEST MODE FOR CARRYING OUT THE INVENTION

Figure 3:
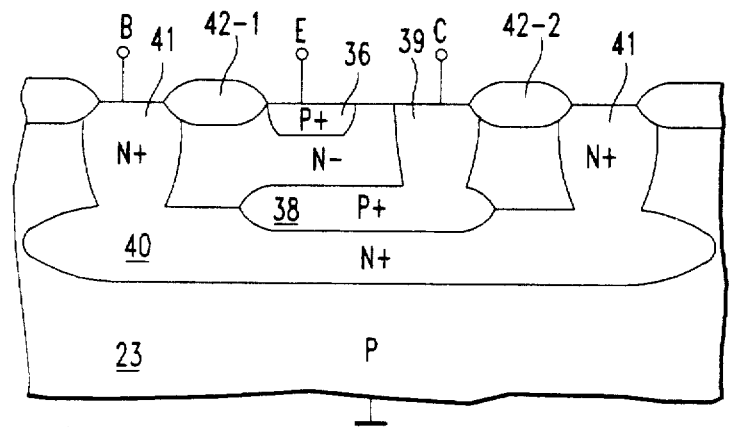
FIG. 3 is a cross-sectional view of a prior art vertical isolated-collector PNP transistor structure.
Figure 4:
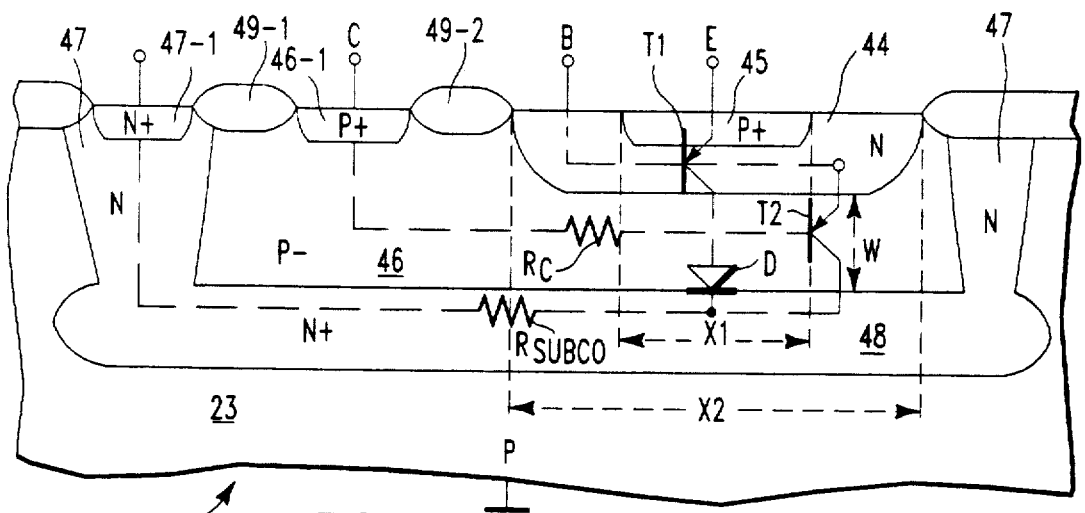
FIG. 4 is a cross-sectional view of a vertical isolated-collector PNP transistor structure that is used to illustrate the basic principles of the present invention.
Figure 5A:
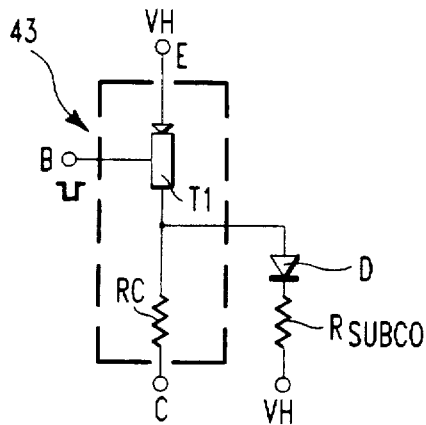
FIG. 5A is a schematic diagram of the PNP transistor structure of FIG. 4, wherein the N+ reach- through contact region is tied to VH.

Referring now to FIG. 4, a PNP transistor structure 43 includes a N base region 44 and a P+ emitter region 45, which are conventionally formed in a P−well region 46 that forms the collector of the transistor. The P− well region 46 is provided with a P+ collector contact region 46-1 and is surrounded by the combination of a N ring-shaped reach-trough region 47, and a N+ buried layer 48 for the isolation from the P substrate 23. The latter is connected to the most negative voltage available on the chip, in this instance, GND. The N reach-through region 47 is provided a N+ contact region 47-1 which is connected to the most positive voltage (VH) for junction isolation purposes. Alternatively, the N reach-through region 47 could be doped at the same level as the N+ buried layer 48. Appropriate ROX regions, including regions 49-1 and 49-2, are used to ensure electrical isolation between adjacent active regions of the PNP transistor at the wafer surface. In particular, the P+ collector contact region 46-1 is separated from the N base region 44 by ROX region 49-2, and from the N+ collector contact region 47-1 by ROX region 49-1. ROX regions are necessary to prevent a potential circuit short by the silicide to be formed subsequently (not represented). The P+ collector contact region 46-1 is no longer connected to GND and therefore is isolated (as required in the construction of block 12 in the circuit of FIG. 1). As is apparent from structure 43 of FIG. 4, parasitic devices are produced along with the PNP transistor (referenced T1). For example, a parasitic NPN transistor T2 is formed by the following three regions: the N region 44 as the collector; the P− well region 46 as the base; and the N+ buried layer 48 as the emitter. Depending on the P− well region thickness W, this NPN transistor T2 may be made either operative or inoperative. The PN junction diode formed between the P− well region 46 and the N+ buried layer 48 is identified by letter D. The collector and the sub-collector resistances are respectively referenced Rc and Rsubco. For adequate operation, N+ collector contact region 47-1 needs to be connected to VH, so that diode D is reverse-biased. Because the vertical isolated-collector PNP transistor of FIG. 4 does not require the P+ subcollector buried layer and the P reach-through region, less process steps are required to manufacture the structure of FIG. 4 than the structure of FIG. 3 or compatible derivatives therewith. However, the collector resistance Rc of the transistor of FIG. 4 due to the sheet-resistance of the P− well region 46, is severely increased when compared to that of the FIG. 3 structure because of the missing P+ buried subcollector layer 38. As a result, the PNP structure of FIG. 4, has limited speed performances. As a matter of fact, with the structure shown in FIG. 4, quite large values of the collector resistance Rc are anticipated in a standard BICMOS technology (e.g. about 200 ohms/sq under the diffused base region 44 and about 3 kilohms/sq under the ROX isolation region 49-2). One way previously utilized to lower this collector resistance Rc is to increase the P− well region thickness W, which in turn, makes the parasitic NPN transistor T2 inoperative, leaving only reverse-biased diode D, as depicted in FIG. 5A which shows the equivalent electrical schematic of the PNP transistor structure 43 of FIG. 4.

The problem caused by a too high collector resistance Rc, however, may be overcome in a different way. According to the present invention, the P+ collector contact region 46-1 and the N+ reach-through contact region 47-1 are shorted together. The new equivalent collector resistance R'c now results from paralleling resistance Rc with the sub-collector resistance Rsubco in series with diode D. Because Rsubco is very low, the equivalent collector resistance R'c is significantly reduced and is much less than Rc (when diode D conducts). It is also important to notice that with the structure of FIG. 4, no problem of isolation occurs due to the suppression of VH. The resultant parasitic devices that would otherwise make implementation of this solution difficult may be resolved by two methods, dependent upon the P− well region thickness W.

Figure 5B:
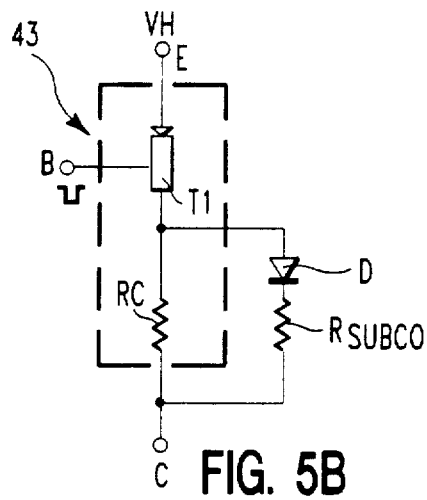
FIG. 5B is a schematic diagram of the PNP transistor structure of FIG. 4, wherein the N+ and P+ contact regions are shorted and the P− well collector region is relatively thick according to a first embodiment of the present invention.

First, if the thickness W is large enough to prevent transistor action, then, transistor T2 can be neglected, and the equivalent electrical schematic of PNP transistor structure 43 becomes that which is shown in FIG. 5B. As apparent from FIG. 5B, structure 43 is comprised of an ideal PNP transistor T1 connected in series with two elements in parallel, i.e. resistor Rc in one branch and diode D and resistor Rsubco in the other branch.

Figure 5C:
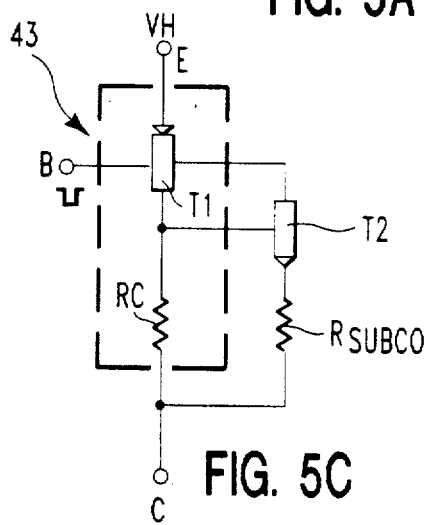
FIG. 5C is a schematic diagram of the PNP transistor structure of FIG. 4, wherein the N+ and P+ contact regions are shorted and the P− well collector region is relatively thin according to a second embodiment of the present invention.

Second, if P− collector well region is thin enough that NPN transistor T2 is active, then a PNPN (thyristor) structure is created from the N+ buried layer 48 to the P+ emitter region 45. FIG. 5C illustrates the electrical circuit equivalent to the PNP transistor structure 43 of FIG. 4, in this latter case, illustrating the connections between transistors T1 and T2.

In summary, it may be understood from FIGS. 5A to 5C that PNP transistor structure 43 can be considered as a PNP transistor T1 merged either on top of PN diode D or on top of NPN transistor T2, depending on whether said NPN transistor T2 has a negligible current gain or not, which in turn depends on the P− well region thickness W.

Latch-up problems however, sometimes exist with parasitic thyristor structures. Tests performed on the influence of the parasitic NPN transistor T2 and diode D in that context have shown that transistor T2 is turned on when the voltage drop across the collector resistance Rc reaches 0.7 volt. The collector current of transistor T2 is added to the PNP base current and speeds up the PNP turn-on transition. Local latch-up takes place if the loop gain is greater than one but the thyristor will automatically switch-off at the end of the transition when the output current dies (as in BICMOS logic circuits, where the load is capacitive only). Different models, depending on different outlines of the NPN transistor T2, the intrinsic area of PNP base, or the total intrinsic plus extrinsic area (see respective widths X1 and X2 in FIG. 4), may be considered for circuit simulations. Average parameters can then be selected for transistors T1 and T2. Theoretically, depending on process parameters and circuit operation, the PNP transistor structure 43 may be considered in the following four different ways, depending on the PNP transistor construction and the value of thickness W.

(1) A circuit corresponding to the schematic of FIG. 5A wherein: PNP transistor T1 has a collector resistance Rc; NPN transistor T2 is neglected; and diode D is always OFF.

(2) A circuit corresponding to the schematic of FIG. 5B wherein: PNP transistor T1 has a collector resistance Rc; and NPN transistor T2 has negligible AC gain (in others words T2 is reduced to diode D).

(3) A circuit corresponding to the schematic of FIG. 5C wherein: PNP transistor T1 has a collector resistance Rc; and NPN transistor T2 is functional (not negligible AC gain).

(4) A circuit which broadly corresponds to the structure of FIG. 3 wherein: PNP transistor T1 has no collector resistance Rc; and NPN transistor T2 is neglected.

Assumptions (1) to (3) have been simulated using the standard device models in order to show the effects of devices making up the PNPN structure. Simulations were made not only to evaluate the impact of the parasitic NPN transistor T2 on the turn-on transition of transistor T1, but also to check its turn-off capability (mainly when thyristor action takes place). The pulse width was narrowed down until the turn-off time was long enough to create a cross-over current at the opposite transition for the pair of complementary bipolar transistors TUP and TDN of the circuit of FIG. 1.

Figure 1:
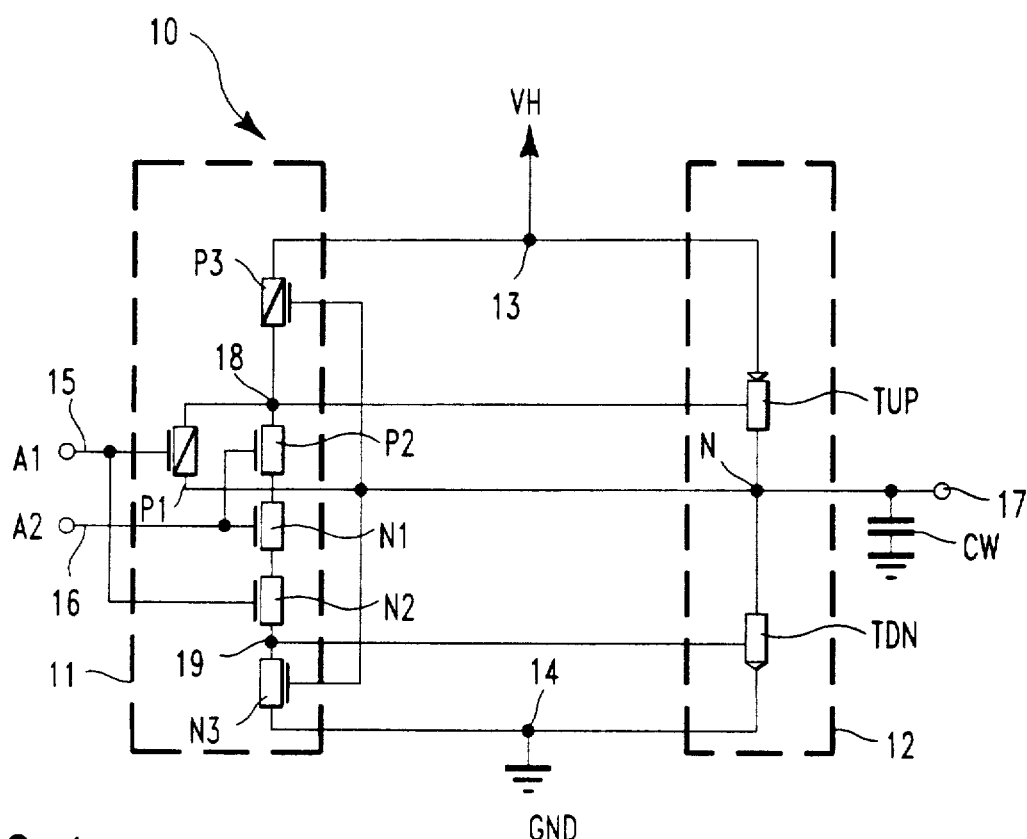
FIG. 1 is a schematic drawing of a prior art BICMOS two-input NAND logic circuit whose output driving stage circuit comprises a top isolated-collector PNP/bottom NPN complementary bipolar transistor pair.
Figure 6:
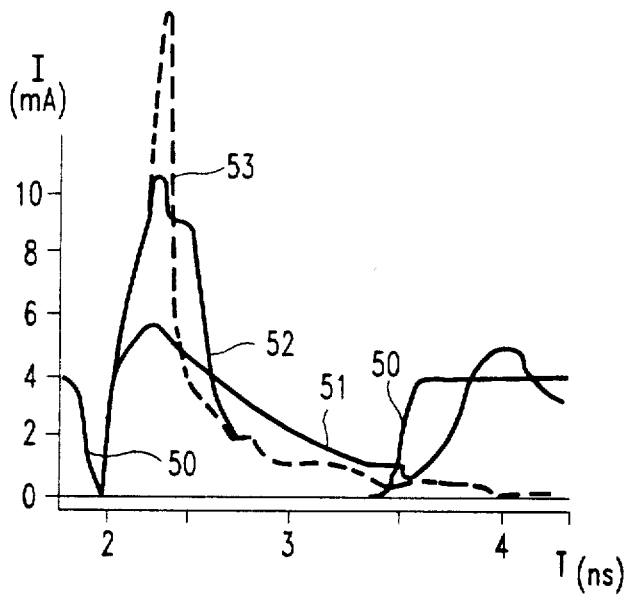
FIG. 6 is a graph of the waveforms of the total pull-up current in the collector of transistor TUP of FIG. 1, in response to an input signal applied to its base, when transistor TUP corresponds to the schematics depicted in FIGS. 5A, 5B and 5C.
Figure 7:
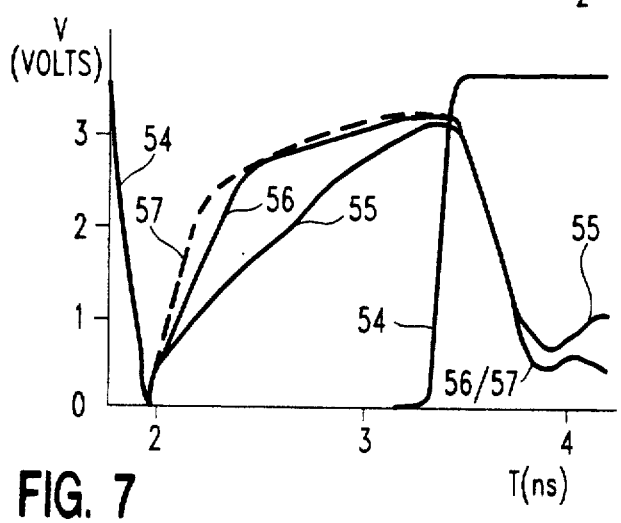
FIG. 7 is a graph of the waveforms of the output voltage VOUT in response to an input signal applied to the base of transistor TUP when the latter corresponds to the schematics depicted in FIGS. 5A, 5B and 5C.

The waveforms of the total current I supplied by the PNP transistor structure 43, and the output voltage VOUT in the context of transistor TUP of FIG. 1 are respectively depicted in FIGS. 6 and 7, for a capacitive loading Cw of 1.0 pF. Curves are given in signal intensity I(mA) and signal voltage V(volts) versus time T(ns).

In FIG. 6, the input signal is referenced 50. The waveforms of the total pull-up current I supplied by PNP transistor TUP of FIG. 1 at the collector electrode is referenced 51, 52 and 53 depending on the equivalent electrical circuit schematic that is used to implement transistor TUP, (FIGS. 5A, 5B and 5C), respectively.

In FIG. 7, the input signal is referenced 54, and the waveforms of output voltage VOUT at node N of FIG. 1 are referenced 55, 56 and 57, depending on the equivalent electrical circuit schematic that is used to implement transistor TUP, (FIGS. 5A, 5B and 5C), respectively.

Examining the waveforms shown an 7 demonstrates that:

a) PNP transistor T1 goes into saturation if there is no diode D across its collector resistor Rc or no thyristor action (see curve 51). This saturation severely decreases the output current I and increases the turn-off time (from 2 to 3.5 ns in FIG. 6); this 1.5 ns delay is not enough when loaded by 1 pF and creates a huge cross-over current which culminates at 4 ns.

b) The effects of the shorted connection (see FIGS. 5B and 5C) and of either diode D or the whole thyristor, improve the pull-up current I by a factor of nearly 2 or 3 (see FIG. 6). In the latter case (see curve 53), this increase corresponds, almost up to the level provided by an ideal PNP transistor with no collector resistance, and results in a significant increase of the speed of the circuit of FIG. 1 when transistor TUP is implemented with the transistor structure 43 corresponding to the schematic of FIG. 5C.

In summary, it is concluded that the N+ buried layer 48 and N reach-through region 47 not only serve as an isolation layer to separate the P— well region 46 (that forms the collector of the PNP transistor) from the P substrate 23, but they also provide a shunt path that reduces the collector resistance of the PNP transistor and therefore speeds up the turn-on transition thereof. This is due to the short between the N+ contact region 47-1 and the P+ collector contact region 46-1. In addition, the transistor action of the parasitic NPN transistor T2 is so effectual that it has to be tuned for maximum efficiency.

Figure 8:
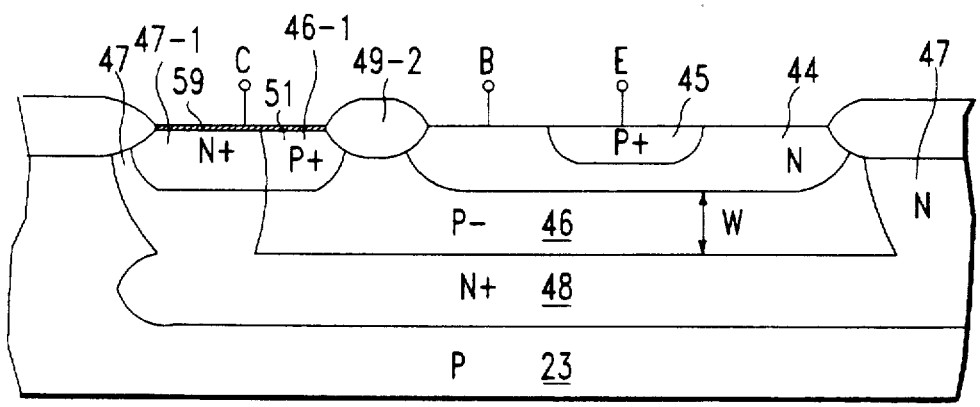
FIG. 8 is a cross-sectional view of the vertical isolated-collector PNP transistor structure according to a first preferred embodiment of the present invention.

FIG. 8 shows the structure 58 of the vertical isolated-collector PNP transistor of the present invention according to the preferred embodiment. This structure 58 is derived from the structure of FIG. 4 and bears identical references. The P— well region 46 is still isolated from the P substrate 23 by the N+ buried layer 48 and the N ring-shaped reach-through region 47. Contact regions 46.1 and 47.1 are merged, however, so that not only the high collector resistance value is strongly reduced, but significant silicon area is saved. A common metal collector contact 59 shorts the contact regions. Finally, the P— well region thickness W is made thin enough to allow transistor action of the parasitic NPN transistor referenced T2 in FIG. 4. As a result, the thyristor mentioned above provides the PNP structure 58 with the capability to drive highly capacitive loads. This is obtained because the thyristor self-extinguishes when the pull-up current drops to a value sufficiently low to induce a voltage smaller than one Vbe across the collector resistance Rc.

Figure 2:
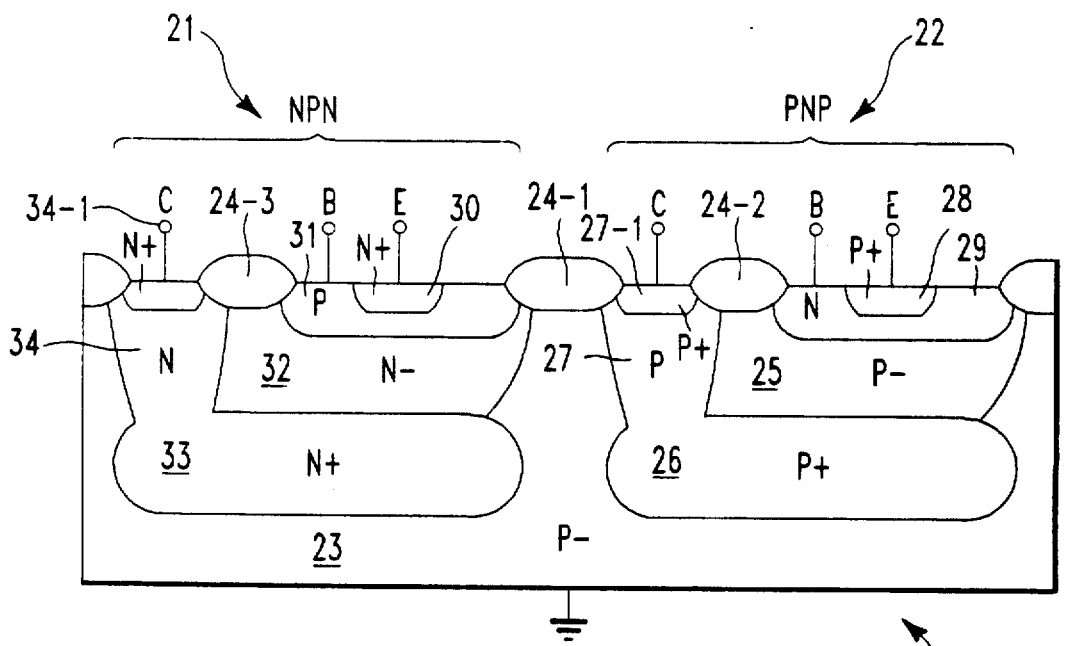
FIG. 2 is a cross-sectional view of a prior art complementary bipolar transistor pair wherein the PNP transistor is of the vertical grounded-collector type obtained by a conventional BICMOS manufacturing process of the merged type.
Figure 9A:
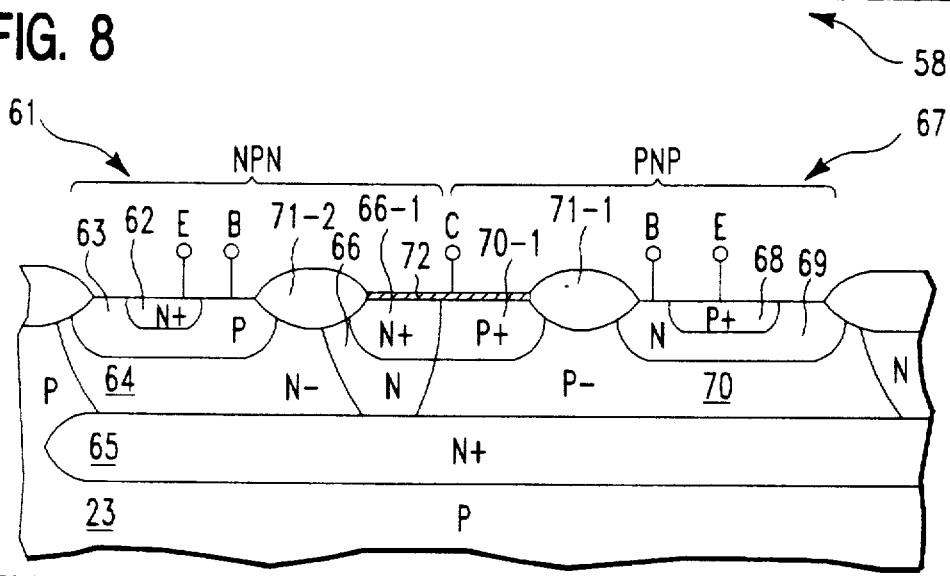
FIG. 9A is a cross-sectional view of the vertical isolated-collector PNP transistor of FIG. 8, merged with a conventional NPN transistor structure.

FIG. 9A shows the merged structure referenced 60 that results from the integration of the PNP transistor of the present invention (as illustrated in FIG. 8) with a conventional NPN transistor according to the standard BICMOS technology of FIG. 2. NPN transistor 61 comprises an N+ emitter region 62, a P base region 63 and a N— collector region 64 in contact with a N+ buried sub-collector layer 65. A N reach-through region 66 in contact with the N+ buried sub-collector layer 65 forms the collector region of the NPN transistor structure 61. Preferably, the N reach-through region 66 is provided with a N+ collector contact region 66-1. Note that N+ collector contact region 66-1 and N reach through region 66 can be merged to form a single N+ reach-through region. Alternatively N reach-through region 66 and N— collector region 64 can be merged in a single N well region. The PNP transistor 67 comprises a P+ emitter region 68, a N base region 69 formed in a P— well region 70 to operate as the collector of the PNP transistor 67. P— well region is provided with a more doped collector contact region 70-1, (e.g. of the P+ type). ROX regions 71-1 and 71-2 provide adequate isolation between the active zone of the merged structure. The NPN transistor structure 61 is merged with the isolated -collector PNP transistor 67 by making the P+ collector contact region 70-1 of the PNP transistor 67 adjacent to the N+ collector contact region 66-1, and by shorting both contact regions by a common metal contact 72 to form the collector electrode of the merged NPN/PNP structure.

The advantages of a such an merged integrated device are:

a) No more spacing between the N+ subcollector region of the NPN transistor and the adjacent N+ subcollector region of the PNP transistor (about 5 μm), since they are now merged in a common sub-collector layer 65.

b) Only one reach through region 66 to access said N+ subcollector layer 65. The ROX region between the NPN and PNP transistors (see 24.1, FIG. 1) is no longer necessary.

c) The PNP and NPN collector contacts can then be butted against the ROX regions 71-1 and 71-2 and tied together at the metal silicide level.

Figure 9B:
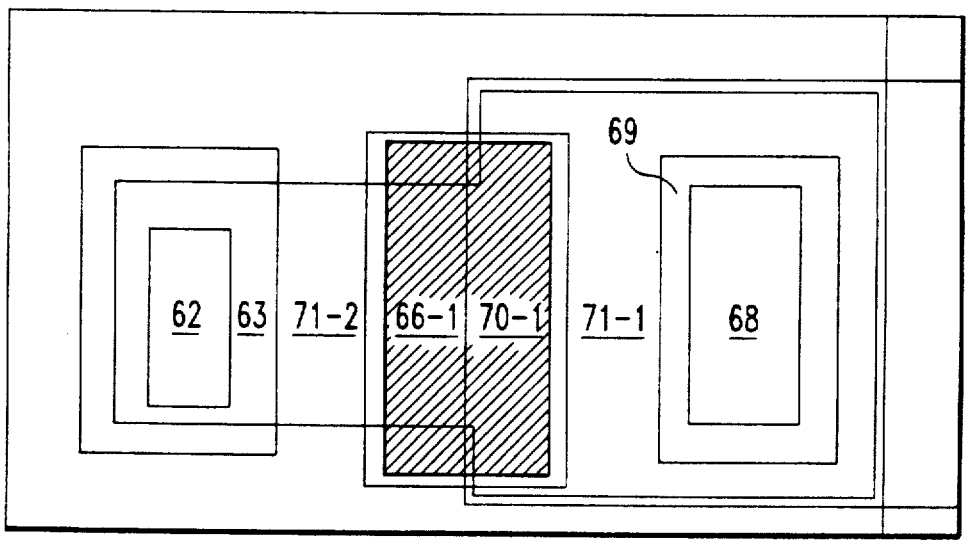
FIG. 9B is a top view, partially cut away, of the layout configuration of the merged structure of FIG. 9A.

The U-shaped reach-through region referenced 27 in the structure of FIG. 2 which was useful to reduce the collector resistance by a factor of about 3, is no longer necessary. A bar-shaped reach-through region now suffices as apparent from the topography shown in FIG. 9B, thereby improving integration density. The other benefit is the reduction of the total collector-substrate capacitance Ccs due to the fact that collector contact regions of both transistors are shorted and their subcollectors merged in a common sub-collector layer.

The following table is quite explicit in that respect:

| Type of device | Total capacitance (fF) | Silicon area $\mu m^2$ TM |
| --- | --- | --- |
| NPN FIG. 2 | 82 | 193 |
| PNP FIG. 2 | 181 | 389 |
| Reduced PNP FIG. 8 | 142 | 288 |
| Merged devices of FIG. 2 (including isolation) | 263 | 682 |
| Merged device of FIG. 9 A | 170 | 441 |

These values show that the parasitic capacitance Ccs and the silicon area are respectively decreased from 263 fF to 170 fF and from 682 $\mu m^2$ to 441 $\mu m^2$, (i.e. about 35% improvement in both cases).

Although the invention has been shown and described with exemplary embodiments thereof, it should be understood by those skilled in the art that the foregoing and various other changes, omissions and additions may be made therein and thereto without departing from the spirit and the scope of the invention.

We claim:

1. A merged NPN/PNP transistor structure formed in a P substrate comprising:
   an N+ buried layer;
   an NPN transistor structure having an N+ region as a first emitter, a P region as a first base, and an N− region as a first collector;
   a PNP transistor having P+ region as a second emitter, an N region as a second base, and a P− well region as a second collector;
   a ring-shaped N reach through region in contact with said N+ buried layer to for a pocket enclosing said PNP transistor structure; and,
   electrical connection means for shorting said N reach-through region and said P− well region to thereby define a collector electrode common to both said NPN and PNP transistors.

2. A merged NPN/PNP transistor structure formed in a P substrate according to claim 1, wherein said first P− well region and said N reach-through region are provided with first and second contact regions, respectively, for receiving said electrical connection.

3. A merged NPN/PNP transistor structure formed in a P substrate according to claim 2, wherein said first and second contact regions are adjacent and shorted by a common metal contact to thereby form said collector electrode.

4. A merged NPN/PNP transistor structure formed in a P substrate according to claim 1, wherein said P− well region has a thickness such that an operative parasitic NPN transistor is formed with said N region forming the collector, said P− well region forming the base, and said N+ buried layer forming the emitter of said parasitic NPN transistor.

* * * * *